(12) United States Patent
Yong et al.

(10) Patent No.: US 11,637,539 B2
(45) Date of Patent: Apr. 25, 2023

(54) SURFACE ACOUSTIC WAVE DEVICE PACKAGE AND METHOD OF MANUFACTURING THE SAME

(71) Applicant: WISOL CO., LTD., Osan-si (KR)

(72) Inventors: Jun Woo Yong, Osan-si (KR); Jung Hoon Han, Osan-si (KR); Bong Soo Kim, Osan-si (KR); Eun Tae Park, Osan-si (KR)

(73) Assignee: WISOL CO., LTD., Osan-si (KR)

( * ) Notice: Subject to any disclaimer, the term of this patent is extended or adjusted under 35 U.S.C. 154(b) by 934 days.

(21) Appl. No.: 16/444,182

(22) Filed: Jun. 18, 2019

(65) Prior Publication Data

US 2019/0393850 A1    Dec. 26, 2019

(30) Foreign Application Priority Data

Jun. 22, 2018 (KR) ........................ 10-2018-0071862

(51) Int. Cl.
*H03H 3/08* (2006.01)
*H03H 9/145* (2006.01)
*H03H 9/02* (2006.01)

(52) U.S. Cl.
CPC .......... *H03H 3/08* (2013.01); *H03H 9/02929* (2013.01); *H03H 9/14502* (2013.01)

(58) Field of Classification Search
CPC .. H03H 3/08; H03H 9/02929; H03H 9/14502; H03H 9/1071; H03H 9/1085; H03H 3/02; H03H 9/02614; H03H 9/058; H03H 9/1064; H03H 9/64

USPC ......................................... 333/133, 193–196
See application file for complete search history.

(56) References Cited

U.S. PATENT DOCUMENTS

| | | | |
|---|---|---|---|
| 7,230,512 B1 * | 6/2007 | Carpenter | H03H 9/1071 333/133 |
| 2003/0109077 A1 | 6/2003 | Kim et al. | |
| 2012/0274179 A1 * | 11/2012 | Nodake | H03H 3/10 29/25.35 |

FOREIGN PATENT DOCUMENTS

| | | |
|---|---|---|
| JP | 2003-174345 A | 6/2003 |
| JP | 2005-268297 A | 9/2005 |
| JP | 2008-005464 A | 1/2008 |
| JP | 2014-161095 A | 9/2014 |
| KR | 10-2006-0115531 A | 11/2006 |
| KR | 10-2018-0017939 A | 2/2018 |
| KR | 10-2018-0055369 A | 5/2018 |

OTHER PUBLICATIONS

CNIPA Office Action, dated Sep. 23, 2022, for Chinese Patent Application No. 201910533085.2 which corresponds to the above-identified U.S. application.

* cited by examiner

*Primary Examiner* — Rakesh B Patel
*Assistant Examiner* — Jorge L Salazar, Jr.
(74) *Attorney, Agent, or Firm* — LRK Patent Law Firm

(57) ABSTRACT

The present invention relates to a surface acoustic wave device package and a method of manufacturing the same, and more specifically, to a method of manufacturing a miniaturized surface acoustic wave device package.

6 Claims, 7 Drawing Sheets

SURFACE ACOUSTIC WAVE DEVICE PACKAGE AND METHOD OF MANUFACTURING THE SAME

CROSS-REFERENCE TO RELATED APPLICATION

This application claims priority to Korean Patent Application No. 10-2018-0071862, filed Jun. 22, 2018, the entire content of which is incorporated herein by reference.

BACKGROUND OF THE INVENTION

1. Field of the Invention

The present invention relates to a surface acoustic wave device package and a method of manufacturing the same, and more specifically, to a method of manufacturing a miniaturized surface acoustic wave device package.

2. Description of Related Art

A surface acoustic wave is an acoustic wave which propagates along the surface of an elastic substrate. Such an acoustic wave is generated from an electrical signal as a result of piezoelectric effect, and if the electric field of the acoustic wave concentrates around the surface of the substrate, the acoustic wave may interact with conductive electrons of another semiconductor, which is put right on the surface of the substrate. A medium which propagates the acoustic wave is a piezoelectric material having high electromechanical coupling coefficient and low acoustic wave energy loss, and the semiconductor is a material having high mobility of the conductive electrons and optimum resistivity, which can secure optimum efficiency as the DC power component is low. An electromechanical device which substitutes for an electronic circuit using interactions of the surface acoustic wave and the conductive electrons of a semiconductor is a SAW device.

The surface acoustic wave device like this is used as an important part of a mobile communication phone and a base station, in addition to various communication applications. The most frequently used type of the SAW device is a pass band filter and a resonator. Owing to a small size and superior technical parameters (low loss, selectivity, etc.), as well as low price, the SAW device occupies practically a higher level of competitiveness compared with the devices based on other physical principles.

Particularly, miniaturization of a package, as well as enhancement of characteristics, is required in the field of filter and resonator, in which a surface acoustic wave device is used, and various manufacturing methods are used to implement the miniaturization. However, a wafer level package (WLP) method for manufacturing conventional miniaturized surface acoustic wave device packages has a problem of lowering the efficiency in mass-production of the miniaturized surface acoustic wave device packages as the method goes through a process of performing a molding process for preventing infiltration of moisture or contaminated materials after individually attaching a plurality of surface acoustic wave devices on a substrate when the surface acoustic wave devices are manufactured.

Accordingly, required is development of a further efficient method for manufacturing a large quantity of surface acoustic wave device packages and a method capable of miniaturizing the surface acoustic wave device packages. The present invention relates to this.

SUMMARY OF THE INVENTION

Therefore, the present invention has been made in view of the above problems, and it is an object of the present invention to provide a method of simply manufacturing a miniaturized surface acoustic wave device package.

In addition, another object of the present invention is to provide a further miniaturized surface acoustic wave device package by using a minimum protection member in the process of performing a molding process for protecting a surface acoustic wave device.

The technical problems of the present invention are not limited to those mentioned above, and unmentioned other technical problems may be clearly understood by those skilled in the art from the following descriptions.

To accomplish the above objects, according to one aspect of the present invention, there is provided a method of manufacturing a surface acoustic wave device package using a first substrate, a second substrate disposed in parallel with the first substrate, and a plurality of surface acoustic wave devices disposed between the first substrate and the second substrate, the method comprising the steps of: primarily cutting, along a partitioning line, any one among the first substrate including the plurality of surface acoustic wave devices and the second substrate electrically connected to the first substrate; forming a protection member for wrapping a cut space of the cut substrate and the top of the cut substrate; flattening the protection member formed on the top of the cut substrate; and separating a plurality of surface acoustic wave device packages including a surface acoustic wave device by secondarily cutting the substrate having the flattened protection member and an uncut substrate along a partitioning line.

According to an embodiment, line width of the partitioning line for cutting any one among the first substrate and the second substrate at the primarily cutting step may be larger than line width of the partitioning line for cutting the substrate having the flattened protection member and the uncut substrate at the step of separating a plurality of surface acoustic wave device packages.

According to an embodiment, the first substrate and the second substrate may include a dam structure disposed on any one among the first substrate and the second substrate to connect the first substrate and the second substrate and wrap an electrode pattern, and the step of forming a protection member may include forming the protection member to wrap the dam structure.

According to an embodiment, the step of flattening the protection member may include flattening the protection member formed on the top, as high as to expose an electrode pad, when the cut substrate includes the electrode pad exposed from the top surface of the cut substrate.

According to an embodiment, the step of separating a plurality of surface acoustic wave device packages may include cutting the substrates to dispose a side surface of the cut substrate and a side surface of the protection member on a same plane.

According to an embodiment, the first substrate and the second substrate may be formed of any one among a silicon substrate, a diamond substrate, a sapphire substrate, a silicon carbide substrate, a LiNbO$_3$ substrate, a LiTaO$_3$ substrate, and a printed circuit board (PCB).

According to an embodiment, the step of forming a protection member may include forming the protection member using any one among a method of attaching a film-type protection member, a method using a liquid-type protection member, a transfer molding method, and a compression molding method.

According to another embodiment of the present invention, there is provided a surface acoustic wave device package including: a first substrate and a second substrate electrically connected to the first substrate; an electrode pattern disposed on any one among the first substrate and the second substrate in a space between the first substrate and the second substrate to generate a surface acoustic wave; a dam structure disposed on any one among the first substrate and the second substrate to wrap the electrode pattern; and a protection member formed to wrap the outer side surface of the dam structure and the side surface and the bottom surface of any one among the first substrate and the second substrate.

According to an embodiment, the protection member may be formed to dispose the side surface of the protection member and the side surface of the first substrate or the second substrate on a same plane.

According to an embodiment, when any one among the first substrate and the second substrate includes an electrode pad exposed from the top surface, the protection member may be formed as high as to expose the electrode pad.

According to an embodiment, the first substrate and the second substrate may be formed of any one among a silicon substrate, a diamond substrate, a sapphire substrate, a silicon carbide substrate, a LiNbO$_3$ substrate, a LiTaO$_3$ substrate, and a printed circuit board (PCB).

DETAILED DESCRIPTION OF THE PREFERRED EMBODIMENT

Hereinafter, preferred embodiments of the present invention will be described in detail with reference to the accompanying drawings. Advantages and features of the present invention and a method for achieving the same will be more clearly understood with reference to the embodiments described below, together with the accompanying drawings. However, the present invention is not limited to the embodiments disclosed below, but may be implemented in various different forms. The embodiments are provided merely to complete disclosure of the present invention and to fully provide a person having ordinary skill in the art to which the present invention pertains with the category of the present invention. The present invention is defined only by the category of the claims. Wherever possible, the same reference numbers will be used throughout the specification to refer to the same or like parts.

Unless otherwise defined, all terms used in this specification (including technical and scientific terms) may be used as a meaning that can be commonly understood by those skilled in the art. In addition, the terms defined in a generally used dictionary are not to be ideally or excessively interpreted unless the terms are clearly and specially defined. The terms used in this specification are not to limit the present invention, but to describe the embodiments. In this specification, singular forms are intended to include plural forms as well, unless the context clearly indicates otherwise.

The terms "comprises" and/or "comprising" used herein specify that the stated components, steps, operations and/or elements do not preclude the presence or addition of one or more other components, steps, operations and/or elements.

Figure 1:
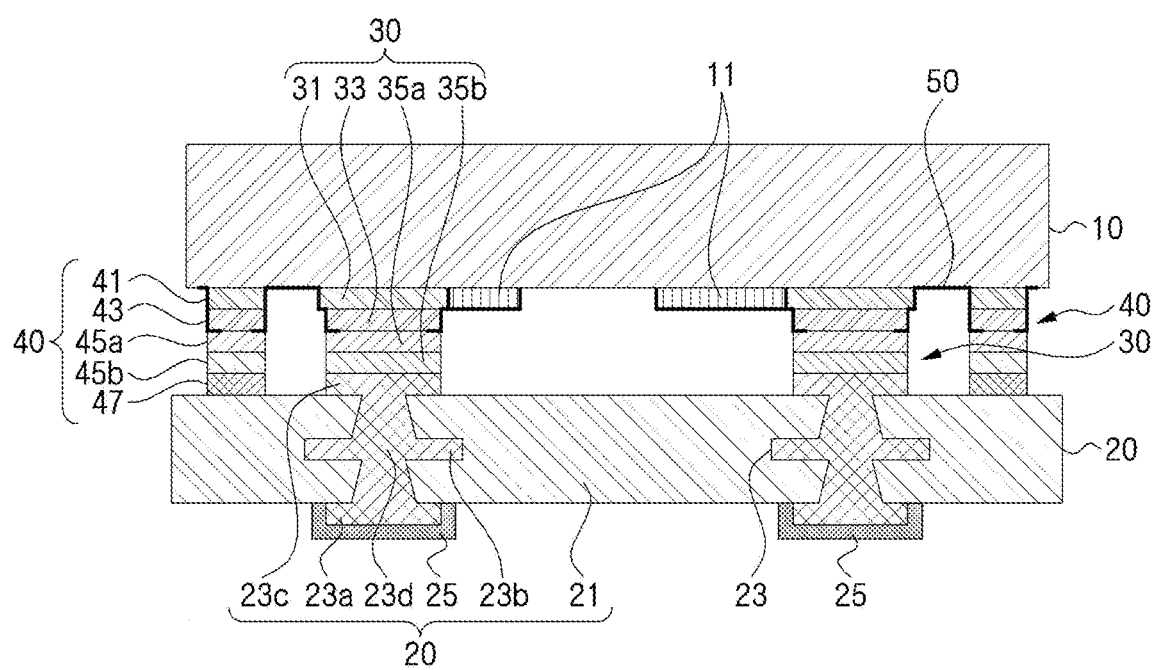
FIG. 1 is a cross-sectional view showing a surface acoustic wave device according to an embodiment of the present invention.

FIG. 1 is a cross-sectional view showing a surface acoustic wave device 100 according to an embodiment of the present invention.

Referring to FIG. 1, a surface acoustic wave device 100 according to an embodiment of the present invention may include a first substrate 10, a second substrate 20, an electrode structure 30 disposed in the space between the first substrate 10 and the second substrate 20, a dam structure 40, and a protection film 50.

First, the first substrate 10 and the second substrate 20 may include various types of substrates capable of manufacturing a surface acoustic wave device package 1 which provides a piezoelectric effect using a wafer level package (WLP) manufacturing process. For example, the first substrate 10 and the second substrate 20 may be configured of any one among a silicon substrate, a diamond substrate, a sapphire substrate, a silicon carbide substrate, a LiNbO$_3$ substrate and a LiTaO$_3$ (LT) substrate, which can generate a piezoelectric effect, or a printed circuit board (PCB) electrically connected to the substrates which generate the piezoelectric effect.

Meanwhile, in the description described below, it is assumed that the first substrate 10 is a substrate which can generate a piezoelectric effect, and the second substrate 20 is a printed circuit board (PCB) for using a wafer level package manufacturing process.

According to embodiments, the first substrate 10 may include an electrode pattern 11 for generating surface acoustic waves. More specifically, the electrode pattern 11 may be an Inter Digitated Transducer (IDT) electrode of a comb shape. In addition, the electrode pattern 11 is formed of a material having excellent electrical characteristics, such as copper Cu, silver Ag, palladium Pd, aluminum Al, nickel Ni, titanium Ti, gold Au, platinum Pt or the like, and enhances the piezoelectric effect of the surface acoustic wave device 100, and materials of the electrode pattern 11 are not limited thereto.

Meanwhile, the second substrate 20 configured of a printed circuit board (PCB) may include an insulation layer 21, first, second and third electrode layers 23a, 23b and 23c which are parallel in the thickness direction of the second substrate 20, a via hole 23d for connecting the first, second and third electrode layers 23a, 23b and 23c in the thickness direction of the second substrate 20, and an electrode pad 25 for supplying current to the surface acoustic wave device package 1 and protecting an area contacting with the surface acoustic wave device package 1. More specifically, the third electrode layer 23c closest to the first substrate 10, which can generate the piezoelectric effect among the first, second and third electrode layers 23a, 23b and 23c, may be disposed at a location corresponding to the electrode pad 31 of the first substrate 10 described below. In addition, although it is described in an embodiment of the present invention that the second substrate 20 includes the first, second and third electrode layers 23a, 23b and 23c, it is not limited thereto, and the second substrate 20 may include a plurality of electrode layers and generate a piezoelectric effect through the plurality of electrode layers.

Meanwhile, in the case of the first electrode layer 23a formed on a side of the second substrate 20 on which the surface acoustic wave device package 1 including the surface acoustic wave device 100 described below is attached, since there is a fixed area for attaching the surface acoustic wave device package 1, the location of disposing the first electrode layer 23a may be fixed, unlike the third electrode layer 23c.

Like this, the second electrode layer 23b may be disposed between the first electrode layer 23a and the third electrode layer 23c to electrically connect the first electrode layer 23a and the third electrode layer 23c, of which disposed locations are different from each other, and the first, second and third electrode layers 23a, 23b and 23c may be electrically connected through the via hole 23d passing through the second substrate 20 in the thickness direction.

In addition, as the second substrate 20 includes the first, second and third electrode layers 23a, 23b and 23c, which can be formed at different locations, and the via hole 23d, diverse surface acoustic wave device packages 1, which are not limited to the electrode structure of the surface acoustic wave device 100, can be designed.

In addition, the second substrate 20 configured of a printed circuit board may include a dam 40 disposed along the edge of a side facing the first substrate 10 to protect the surface acoustic wave device 100 from moisture or contaminated materials, and details thereof will be described below.

Next, the electrode structure 30 is disposed between the first substrate 10 and the second substrate 20 and may electrically connect the first substrate 10 and the second substrate 20. More specifically, the electrode structure 30 may include an electrode pad 31, an under bump metal (UBM) layer 33, and conjunction layers 35a and 35b.

According to embodiments, the electrode pad 31 (primary film) is disposed on one side of the first substrate 10 which generates a piezoelectric effect, may perform a function of converting an electrical signal into a surface acoustic wave, together with the electrode pattern 11 of the first substrate 10, when the electrical signal is inputted into the surface acoustic wave device package 1, and may be formed of a conductive material.

In addition, the UBM layer 33 (secondary film) is disposed to easily couple the first substrate 10 and the second substrate 20 and may be formed by stacking metals of different materials into multiple layers. For example, the UBM layer 33 (secondary film) may be configured in a multilayer form of three to seven layers as titanium Ti and aluminum Al may be alternately disposed (Ti, Al, Ti) or gold Au, copper Cu, and tin Sn may be additionally stacked.

The conjunction layers 35a and 35b, which are the last structure of the electrode structure 30, are disposed to physically couple the first substrate 10 and the second substrate 20 and may be configured in the form of stacking copper Cu and tin Sn in order. In addition, as an additional metal layer for enhancing the coupling force is additionally formed between the UBM layer 33 (secondary film) and the conjunction layers 35a and 35b, the first substrate 10 and the second substrate 20 may be firmly coupled, and the additional metal layer may be formed of titanium Ti or copper Cu.

Next, the dam structure 40 may be disposed to protect the electrode pattern 11 and the electrode structure 30 disposed between the first substrate 10 and the second substrate 20. More specifically, the dam structure 40 may include a first ground electrode 41 disposed on one side of the first substrate 10, an under bump metal (UBM) layer 43, conjunction layers 45a and 45b, and a second ground electrode 47.

According to embodiments, the first ground electrode 41 and the second ground electrode 47 may be disposed on the first substrate 10 and the second substrate 20, respectively, and as the first ground electrode 41 and the second ground electrode 47 are disposed, the current supplied to the surface acoustic wave device package 1 may smoothly flow. In addition, the first ground electrode 41 and the second ground electrode 47 may be formed of the same material as those of the electrode pattern 11 and the electrode pad 31.

In addition, the UBM layer 43 and the conjunction layers 45a and 45b included in the dam structure 40 are also disposed to firmly couple the first substrate 10 and the second substrate 20, like the UBM layer 33 and the conjunction layers 35a and 35b of the electrode structure 30, and may perform a function of protecting the electrode structure 30.

In addition, the conjunction layers 45a and 45b, which are the last structure of the dam structure 40, are also disposed to physically couple the first substrate 10 and the second substrate 20, like the conjunction layers 35a and 35b of the electrode structure 30, and may be configured in the form of stacking copper Cu and tin Sn in order. According to embodiments, the conjunction layers 45a and 45b have a stack structure of an order of copper Cu, tin Sn and copper Cu or may include gold Au to have a structure stacked in order of gold Au, tin Sn and copper Cu or gold Au, tin Sn and gold Au, and materials forming each layer may be separately coupled to the first substrate 10 and the second substrate 20. For example, the first substrate 10 includes copper Cu and tin Sn, and the second substrate 20 includes copper Cu, and when the first substrate 10 and the second substrate 20 are coupled, the conjunction layers 45a and 45b may be configured. Meanwhile, the conjunction layers 35a and 35b of the electrode structure 30 may also have the same stack structure as that of the conjunction layers 45a and 45b of the dam structure 40.

Finally, the protection film 50 may be formed to protect the electrode pattern 11 which generates surface acoustic waves, the electrode structure 30, and the dam structure 40. According to embodiments, the protection film 50 may be formed in the area other than the area where the conjunction layers 35 and 45 are disposed, and for example, the protection film 50 may be formed by stacking silicon oxide $SiO_x$ or silicon nitride SiN as a single layer or a multi-layer.

Until now, a surface acoustic wave device according to an embodiment of the present invention has been described, and hereinafter, a method of manufacturing a plurality of surface acoustic wave devices 100 manufactured using the first substrate 10 and the second substrate 20 in a miniaturized package form will be described.

FIGS. 2 to 5 are views showing the flow of a method of manufacturing a surface acoustic wave device package 1 according to an embodiment of the present invention.

Figure 2:
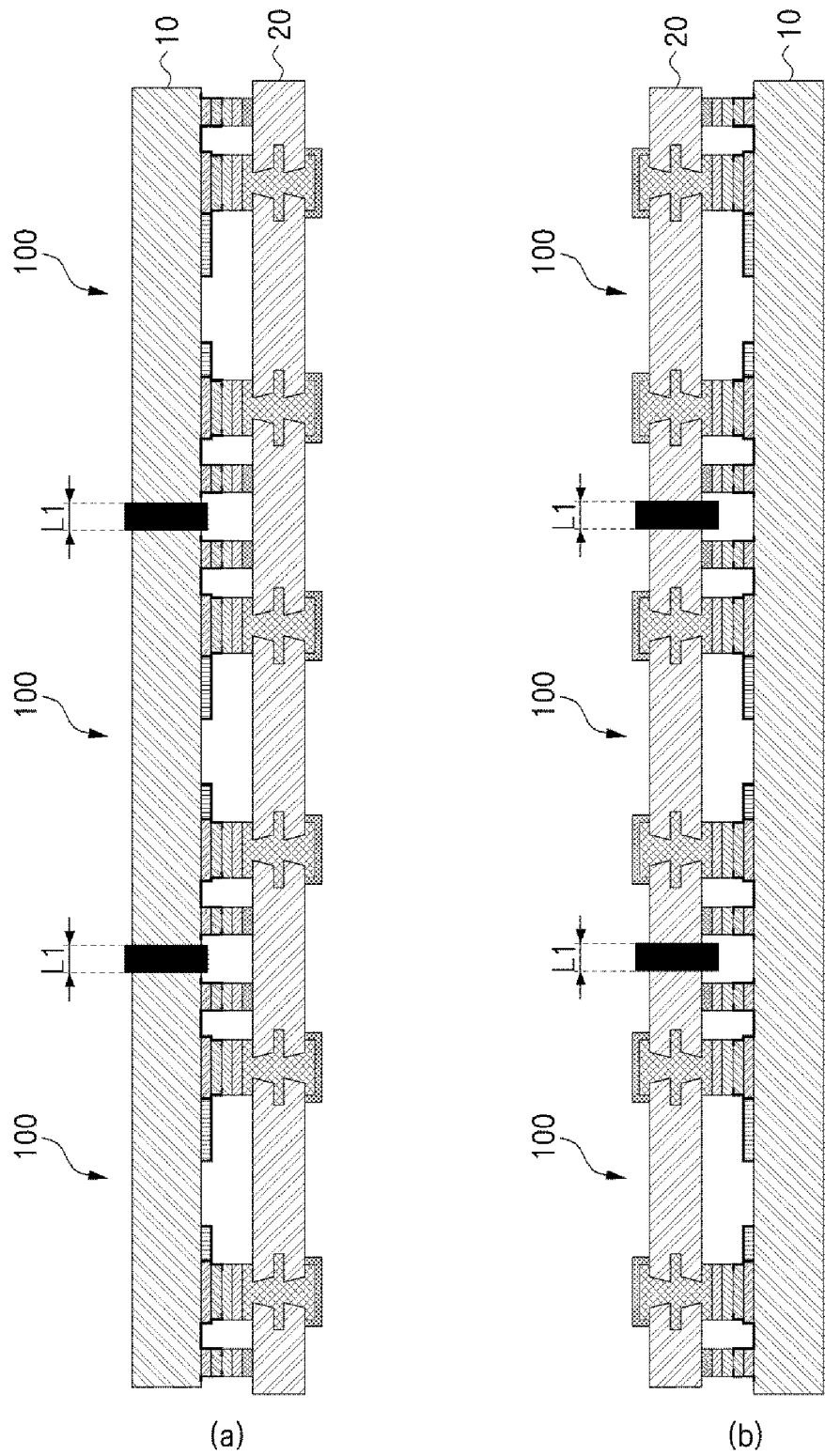
FIGS. 2 to 5 are views showing the flow of a method of manufacturing a surface acoustic wave device package according to an embodiment of the present invention.

Referring to (a) and (b) in FIG. 2, any one substrate among the first substrate 10 including a plurality of surface acoustic wave devices 100 and the second substrate 20 electrically connected to the first substrate 10 is primarily cut along a partitioning line. According to embodiments, the partitioning line for cutting the first substrate 10 or the second substrate 20 may be formed on the surface of the first substrate 10 or the second substrate 20 and may separate the plurality of surface acoustic wave devices 100 into individual surface acoustic wave devices 100 along the partitioning line. In addition, the line width L1 of the partitioning line partitioning the first substrate 10 or the second substrate may be set differently according to the size of the surface acoustic wave devices 100, and the process of cutting the first substrate 10 or the second substrate 20 may be performed in various methods such as blade cutting, laser cutting, plasma cutting and the like.

Figure 3:
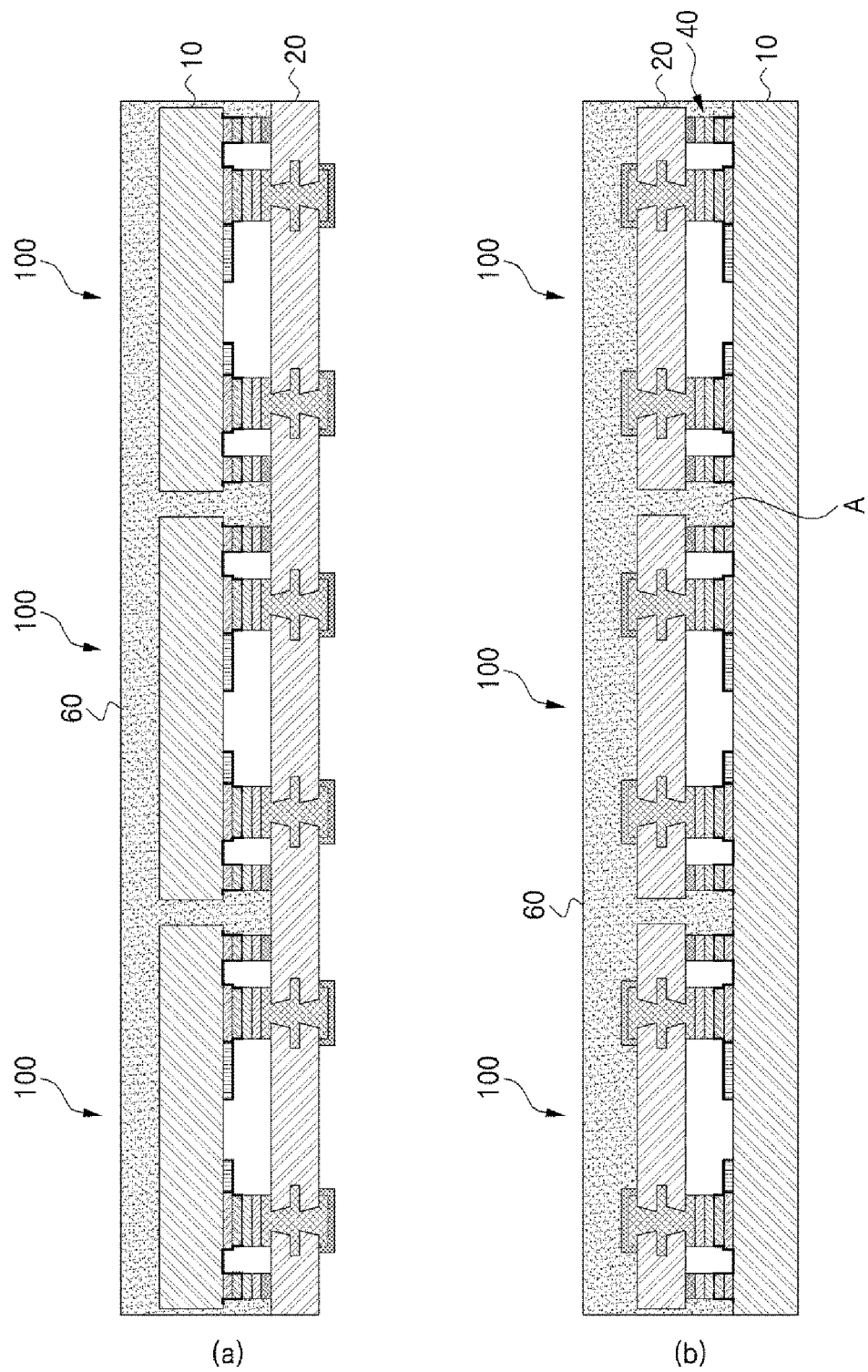

Next, referring to (a) and (b) in FIG. 3, a protection member 60 for wrapping the configurations mentioned above is formed in the cut space A of the first substrate 10 or the second substrate 20 and on the top of the first substrate 10 or the second substrate 20. The cut space A of the first substrate 10 or the second substrate 20 means a space between the line of line width L1 formed in the process of cutting the first substrate 10 or the second substrate 20 and the protection dam 40 of the plurality of the surface acoustic wave devices 100, and the protection member 60 may flow into the cut space A and contact with the outer side surface of the dam structure 40 disposed between the first substrate 10 and the second substrate 20.

According to embodiments, a thermosetting resin material of an epoxy mold compound (EMC) or the like may be used as the protection member 60, and as the second substrate 20 is cut, the protection member 60 may be injected and cured as much as to cover the cut space A formed in the first substrate 10 and the second substrate 20 and the entire top surface of the first substrate 10 or the second substrate 20.

In addition, the protection member 60 may be formed using any one among a method of attaching a film-type protection member, a method using a liquid-type protection member, a transfer molding method, and a compression molding method.

Figure 4:
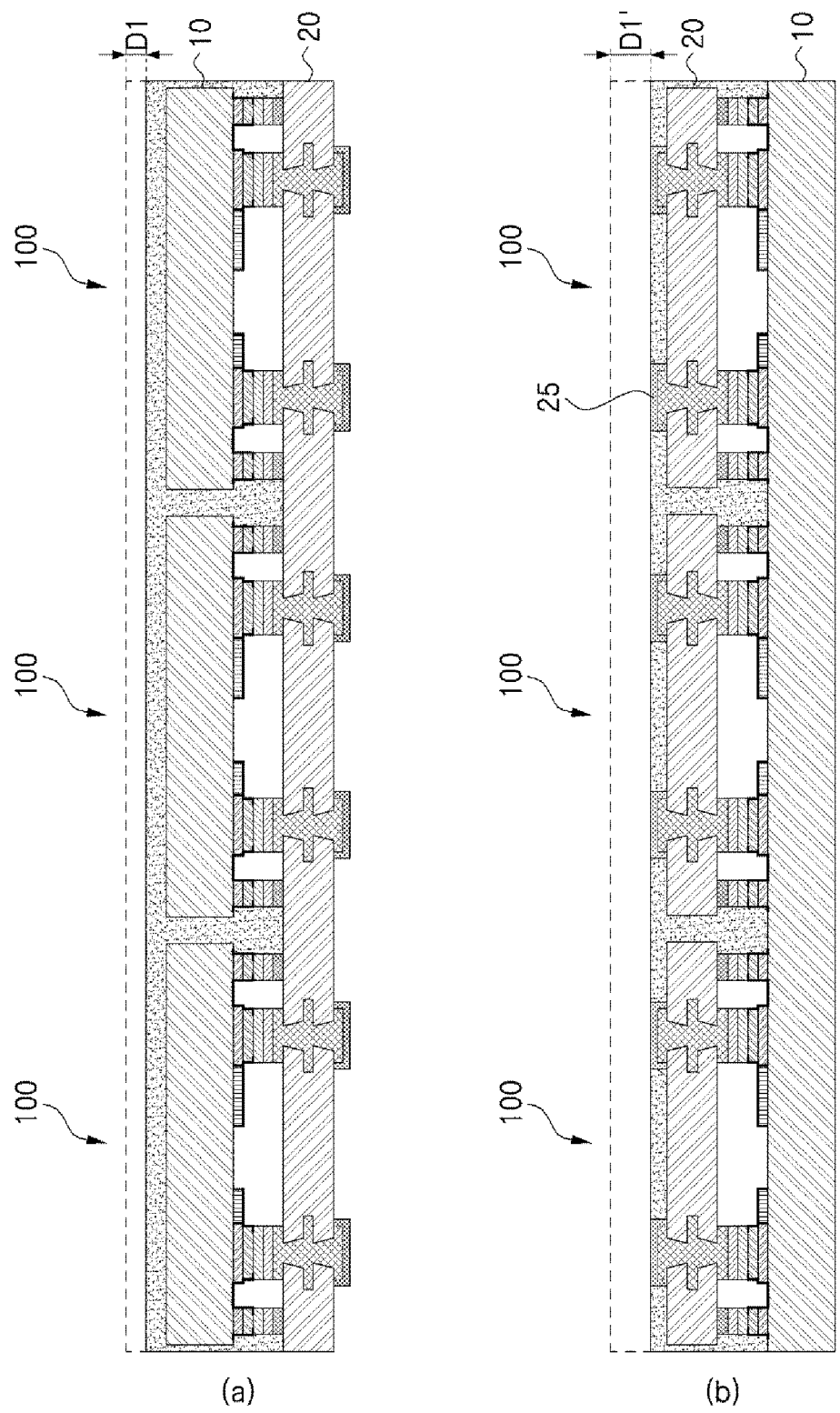

Next, referring to (a) and (b) in FIG. 4, after the protection member 60 is cured and formed in the cut space A of the first substrate 10 or the second substrate 20 and on the top of the first substrate 10 or the second substrate 20, the protection member 60 formed on the top of the first substrate 10 or the second substrate 20 may be flattened by grinding the protection member 60. In addition, as the protection member 60 is flattened, the height of the entire surface acoustic wave device package 1 is reduced, and thus the surface acoustic wave device package 1 can be miniaturized.

Meanwhile, the process of flattening the protection member 60 may flatten the protection member 60 to have a different thickness according to the type of a substrate on which the protection member 60 is formed. According to embodiments, when the protection member 60 on the first substrate 10 which can generate a piezoelectric effect is flattened, the thickness D1 of the flattened protection member 60 may be a minimum thickness which can protect the surface acoustic wave device package 1. However, it is not limited thereto, and the protection member 60 formed on the first substrate 10 may be flattened to completely expose the first substrate 10 according to a device to which the surface acoustic wave device package 1 is applied.

In addition, according to embodiments, when the second substrate 20 includes an electrode pad 25 exposed from the top surface as shown in (b) of FIG. 4, the electrode pad 25 may be exposed from the protection member 60 by flattening the protection member 60 as much as the thickness D1' exposing the electrode pad 25.

Figure 5:
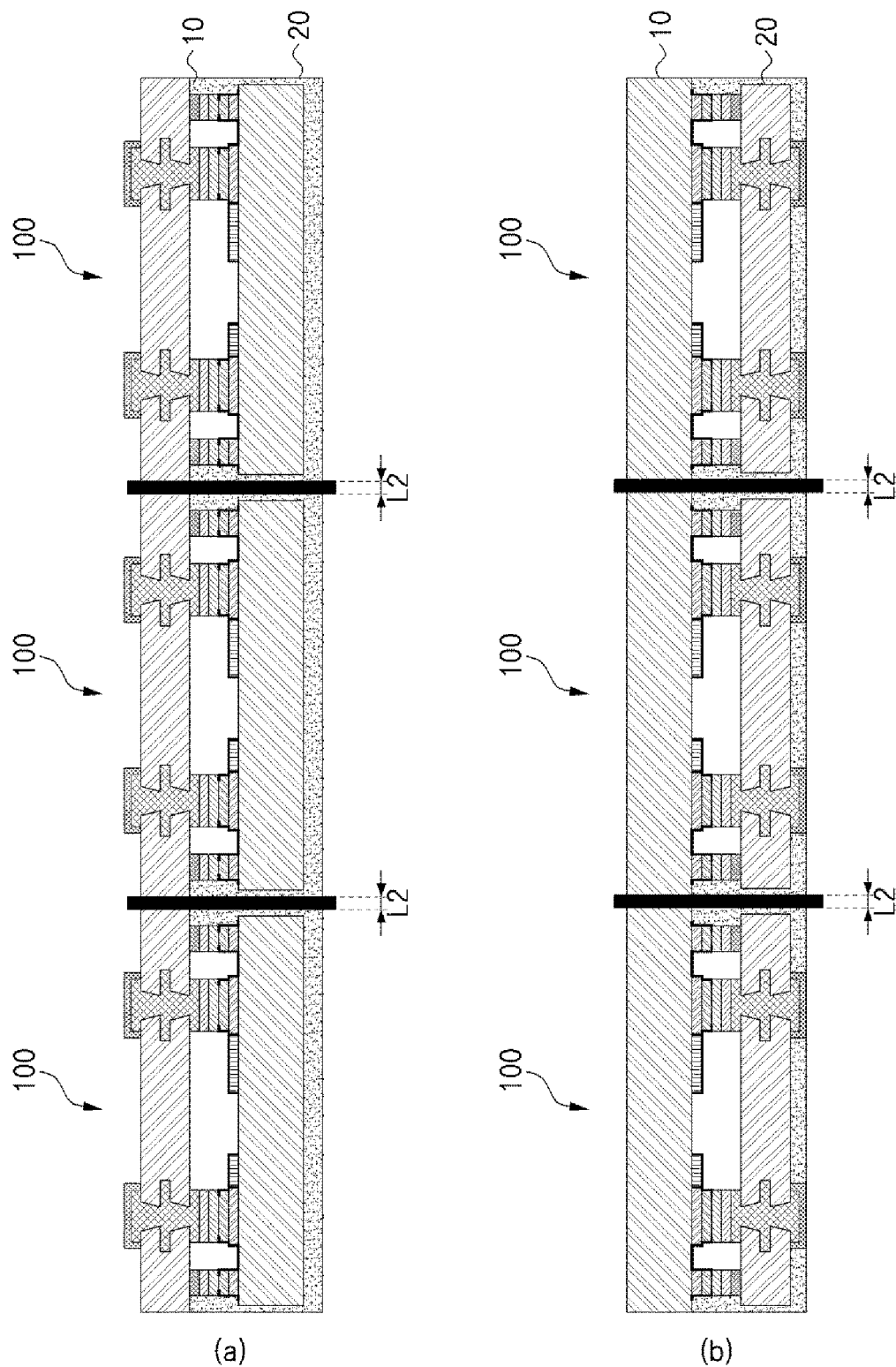

Next, referring to (a) and (b) in FIG. 5, after turning over a plurality of surface acoustic wave devices 100 having the protection member 60 formed thereon so that the top surface of the first substrate 10 or the second substrate 20 may be shown, a plurality of surface acoustic wave device packages 1 including one piece of surface acoustic wave device 100 is separated by simultaneously cutting the first substrate 10 and the second substrate 20 along the partitioning line, i.e., secondarily cutting the first substrate 10 or the second substrate 20. According to embodiments, the partitioning line for simultaneously cutting the first substrate 10 and the second substrate 20 may be formed on the surface of the first substrate 10. In addition, the line width L2 of the partitioning line for simultaneously cutting the first substrate 10 and the second substrate 20 may be smaller than the line width L1 used in the process of cutting the first substrate 10 or the second substrate 20 at the step of FIG. 2. Accordingly, the side surface of the protection member 60 wrapping the first substrate 10 or the second substrate 20 may remain without being cut, and thus coupling force of the surface acoustic wave device package 1 can be enhanced.

Meanwhile, although a case of turning over the substrate to expose the surface of the second substrate 20 after forming the first substrate 10 has been described as the partitioning line for cutting the first substrate 10 and the second substrate 20 is formed on the surface of the first substrate 10 and the second substrate 20, it is not limited thereto, and various methods capable of cutting the physically connected first substrate 10 and second substrate 20 individually or together may be applied.

Until now, a method of manufacturing a surface acoustic wave device package 1 of the present invention has been described. According to the present invention, as the protection member is formed by cutting only part of the substrate without forming the protection member after individually cutting the surface acoustic wave device 100 manufactured through the wafer level package manufacturing process, the amount of the protection member is reduced, and throughput of the manufacturing process can be enhanced. Hereinafter, the configuration of a surface acoustic wave device package 1 completed through the manufacturing method will be described.

Figure 6A:
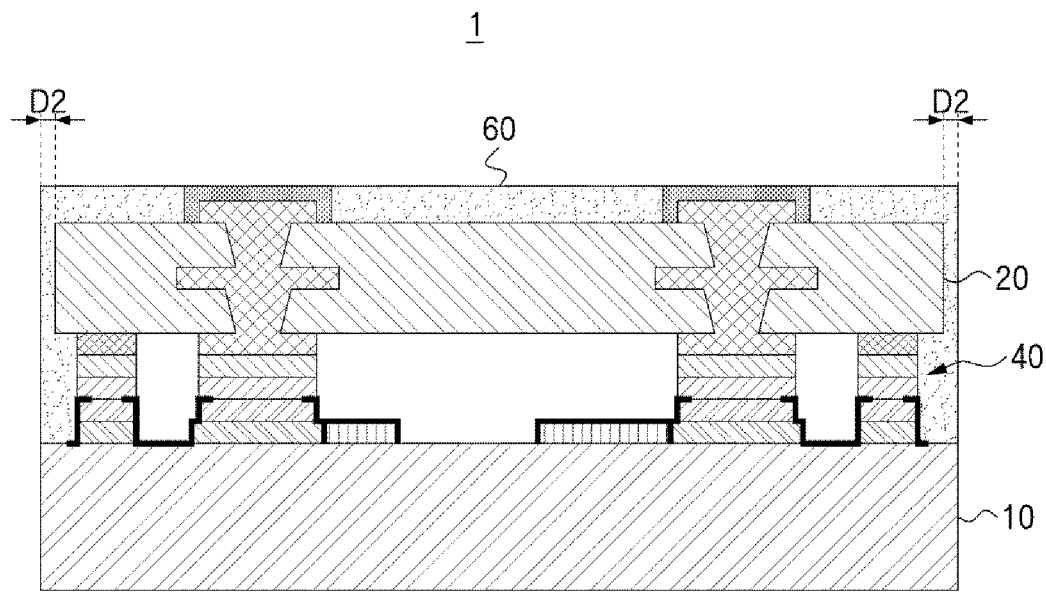
FIGS. 6A and 6B are cross-sectional views showing a surface acoustic wave device package according to an embodiment of the present invention.
Figure 6B:
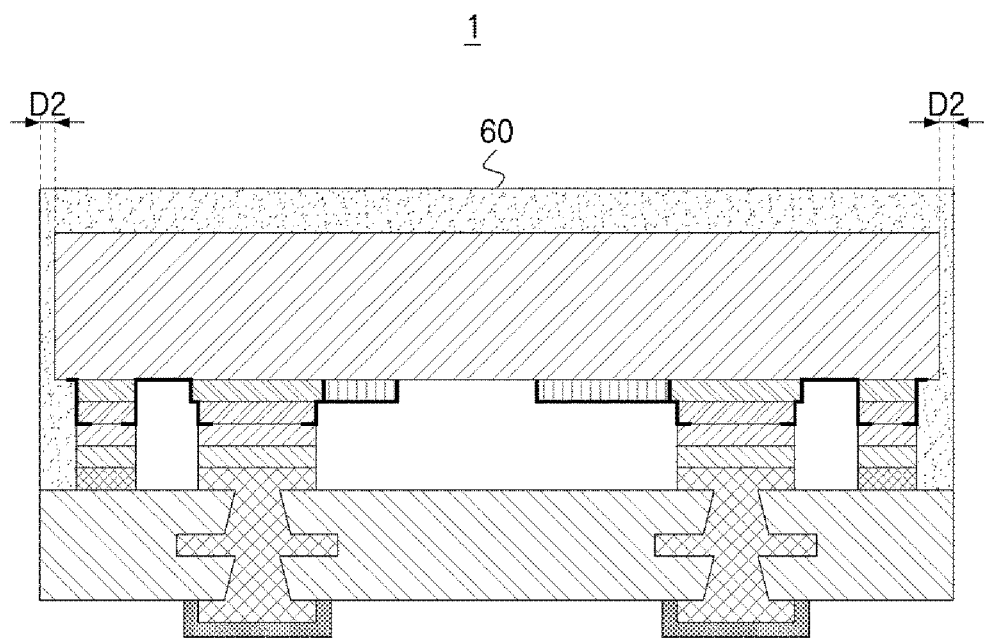
Figure 7:
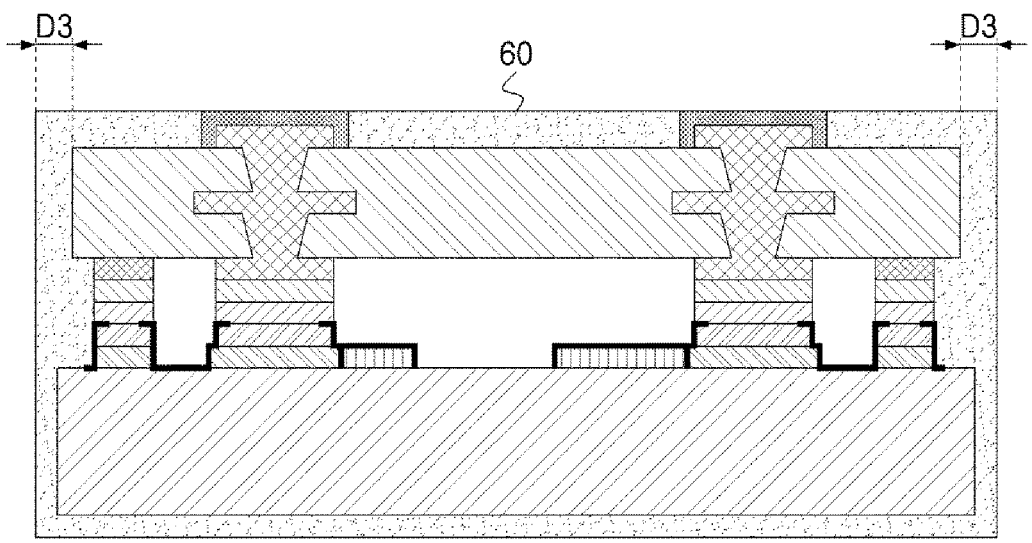
FIG. 7 is a cross-sectional view showing a surface acoustic wave device package manufactured in a conventional manufacturing method.

FIGS. 6A and 6B are cross-sectional views showing a surface acoustic wave device package 1 according to an embodiment of the present invention, and FIG. 7 is a cross-sectional view showing a surface acoustic wave device package manufactured in a conventional manufacturing method.

Referring to FIGS. 6A and 6B, it is confirmed that in the surface acoustic wave device package 1 completed in the manufacturing method of the present invention, a chip size package (CSP) can be manufactured as the side surface of the protection member 60 wrapping the side surface of the first substrate 10 or the second substrate 20 is disposed on the same plane as that of the side surface of the first substrate 10 or the second substrate 20 that is not wrapped by the protection member 60.

Meanwhile, referring to FIG. 7, it is confirmed that when the protection member is formed after individually cutting a surface acoustic wave device as shown in the prior art, thickness D3 of the protection member 60 wrapping the side surface of a substrate is larger than the thickness D2 of the protection member 60 of the present invention. In addition, since the conventional surface acoustic wave device package wraps both of the substrates, there is a restriction in the miniaturization as the entire height increases.

On the other hand, since the protection member 60 wraps even the outer side surface of the dam structure 40 formed between the first substrate 10 and the second substrate 20, the surface acoustic wave device package 1 manufactured in the manufacturing method of the present invention may maintain reliability of the surface acoustic wave device package 1 and accomplish miniaturization of the surface acoustic wave device package 1 by using a small amount of protection member 60.

Meanwhile, in describing the present invention, although it has been described on the basis of manufacturing the surface acoustic wave device package 1, the manufacturing process of the present invention may be applied in the process of manufacturing a wafer level package of a device using two or more substrates, in addition to the surface acoustic wave device package 1.

According to the present invention, efficiency of the manufacturing process can be enhanced as the method of manufacturing a surface acoustic wave device package is simplified.

In addition, throughput of manufacturing a surface acoustic wave device package can be enhanced as the amount of the protection member used in the process of performing a molding process is decreased.

In addition, there is an effect of miniaturizing a surface acoustic wave device package by using a minimum protection member capable of protecting the surface acoustic wave device in the process of performing a molding process.

The effects of the present invention are not limited to those mentioned above, and unmentioned other effects may be clearly understood by those skilled in the art from the following descriptions.

Although embodiments of the present invention have been described with reference to the attached drawings, those skilled in the art may understand that the present invention can be embodied in other specific forms without changing the technical spirit or essential features thereof. Therefore, it should be understood that the embodiments described above are illustrative, not restrictive, in all aspects.

What is claimed is:

1. A method of manufacturing a surface acoustic wave device package using a first substrate, a second substrate disposed in parallel with the first substrate, and a plurality of surface acoustic wave devices disposed between the first substrate and the second substrate, the method comprising the steps of:
   primarily cutting, along a partitioning line, any one among the first substrate including the plurality of surface acoustic wave devices and the second substrate electrically connected to the first substrate;
   forming a protection member for wrapping a cut space of the cut substrate and a top of the cut substrate;
   flattening the protection member formed on the top of the cut substrate; and
   separating a plurality of surface acoustic wave device packages including package the surface acoustic wave device by secondarily cutting the substrate having the flattened protection member and an uncut substrate among the first and second substrates along a partitioning line,
   wherein the first substrate and the second substrate include a dam structure disposed on any one among the first substrate and the second substrate to connect the first substrate and the second substrate and wrap an electrode pattern, and the step of forming the protection member includes forming the protection member to wrap the dam structure.

2. The method according to claim 1, wherein a line width of the partitioning line for cutting any one among the first substrate and the second substrate at the primarily cutting step is larger than a line width of the partitioning line for cutting the substrate having the flattened protection member and the uncut substrate at the step of separating the plurality of surface acoustic wave device packages.

3. The method according to claim 1, wherein the step of flattening the protection member includes flattening the protection member formed on the top to expose an electrode pad, when the cut substrate includes the electrode pad exposed from a top surface of the cut substrate.

4. The method according to claim 1, wherein the step of separating the plurality of surface acoustic wave device packages includes cutting the substrates to dispose a side surface of the cut substrate and a side surface of the protection member on a same plane.

5. The method according to claim 1, wherein the first substrate and the second substrate are formed of any one among a silicon substrate, a diamond substrate, a sapphire substrate, a silicon carbide substrate, a $LiNbO_3$ substrate, a $LiTaO_3$ substrate, and a printed circuit board (PCB).

6. The method according to claim 1, wherein the step of forming the protection member includes forming the protection member using any one among a method of attaching a film-type protection member, a method using a liquid-type protection member, a transfer molding method, and a compression molding method.

* * * * *